(12) United States Patent
Hsu et al.

(10) Patent No.: US 12,432,998 B2
(45) Date of Patent: Sep. 30, 2025

(54) SEMICONDUCTOR STRUCTURE

(71) Applicant: Winbond Electronics Corp., Taichung (TW)

(72) Inventors: Che-Jui Hsu, Taichung (TW); Ying-Fu Tung, Taichung (TW)

(73) Assignee: WINBOND ELECTRONICS CORP., Taichung (TW)

( * ) Notice: Subject to any disclaimer, the term of this patent is extended or adjusted under 35 U.S.C. 154(b) by 0 days.

(21) Appl. No.: 18/660,728

(22) Filed: May 10, 2024

(65) Prior Publication Data

US 2024/0297226 A1  Sep. 5, 2024

Related U.S. Application Data

(62) Division of application No. 17/723,196, filed on Apr. 18, 2022, now Pat. No. 12,015,059.

(51) Int. Cl.
*H10D 64/01* (2025.01)
*H10D 30/01* (2025.01)
*H10D 30/68* (2025.01)

(52) U.S. Cl.
CPC ....... *H10D 64/035* (2025.01); *H10D 30/0411* (2025.01); *H10D 30/681* (2025.01); *H10D 30/6894* (2025.01)

(58) Field of Classification Search
None
See application file for complete search history.

(56) References Cited

U.S. PATENT DOCUMENTS

| | | | |
|---|---|---|---|
| 6,653,201 B2 | 11/2003 | Chung | |
| 6,989,319 B1 | 1/2006 | Ramsbey et al. | |
| 7,557,007 B2 | 7/2009 | Shimoyama et al. | |
| 8,686,535 B2 | 4/2014 | Sandhu et al. | |
| 8,921,913 B1 | 12/2014 | Hsu et al. | |
| 2002/0195646 A1 | 12/2002 | Tseng | |
| 2004/0166643 A1* | 8/2004 | Doan | H10D 30/6891 438/296 |
| 2005/0194646 A1* | 9/2005 | Inoue | H01L 21/31111 257/374 |
| 2009/0085093 A1 | 4/2009 | Jeon | |
| 2014/0357039 A1 | 12/2014 | Liu et al. | |
| 2015/0115346 A1* | 4/2015 | Hsu | H10D 30/6891 438/257 |
| 2017/0117157 A1 | 4/2017 | Chen et al. | |
| 2020/0091276 A1 | 3/2020 | Cheng | |
| 2022/0367624 A1* | 11/2022 | Lee | H10D 62/121 |

* cited by examiner

*Primary Examiner* — Xiaoming Liu
(74) *Attorney, Agent, or Firm* — Muncy, Geissler, Olds & Lowe, P.C.

(57) ABSTRACT

A semiconductor structure is provided. The semiconductor structure includes a pad layer, a first conductive layer, a second conductive layer, an interlayer dielectric layer, and a control gate. The pad layer is disposed on a substrate. The first conductive layer is disposed on the pad layer. The second conductive layer is disposed on the first conductive layer. The interlayer dielectric layer is disposed on the first conductive layer and the second conductive layer and is in contact with top surfaces of the first conductive layer and the second conductive layer. The control gate is disposed on the interlayer dielectric layer.

9 Claims, 7 Drawing Sheets

SEMICONDUCTOR STRUCTURE

CROSS REFERENCE TO RELATED APPLICATIONS

This application is a Divisional of application Ser. No. 17/723,196, filed Apr. 18, 2022, the entirety of which is incorporated by reference herein.

BACKGROUND OF THE INVENTION

Field of the Invention

The present invention relates to a semiconductor structure and a method of forming the same, and, in particular, to a semiconductor structure that may be used as a memory device and a method of forming the same.

Description of the Related Art

With the trend of scaling of semiconductor devices, the size of memory devices continues to shrink, resulting in increased capacitive coupling between adjacent elements or components of interconnect structures, leakage current and/or short circuit problems. In addition, due to the continuous shrinking in size, it is difficult to perform the filling process, so that voids or seams are often formed in the fill material, which adversely affects the reliability and electrical performance of the subsequently formed memory device.

BRIEF SUMMARY OF THE INVENTION

In view of the above problems, the present invention improves the control accuracy of the etch-back depth of the subsequent etch-back process by improving the uniformity of the planarization process, so that the aspect ratio of the opening and/or the trench can be effectively adjusted, thereby reducing the probability of voids or seams in the material filled into the openings and/or trenches. Furthermore, in the present invention, the implantation process and the planarization process are used together to perform the filling process. Therefore, the upper portion of the opening and/or the trench can have a larger width, so as to further improve the filling capability of the filling process.

An embodiment of the present invention provides a semiconductor structure. The semiconductor structure includes a substrate, a pad layer, a first conductive layer, a second conductive layer, an interlayer dielectric layer and a control gate. The pad layer is disposed on the substrate. The first conductive layer is disposed on the pad layer. The second conductive layer is disposed on the first conductive layer. The interlayer dielectric layer is disposed on the first conductive layer and the second conductive layer and in contact with top surfaces of the first conductive layer and the second conductive layer. The control gate is disposed on the interlayer dielectric layer.

DETAILED DESCRIPTION OF THE INVENTION

Figure 1:
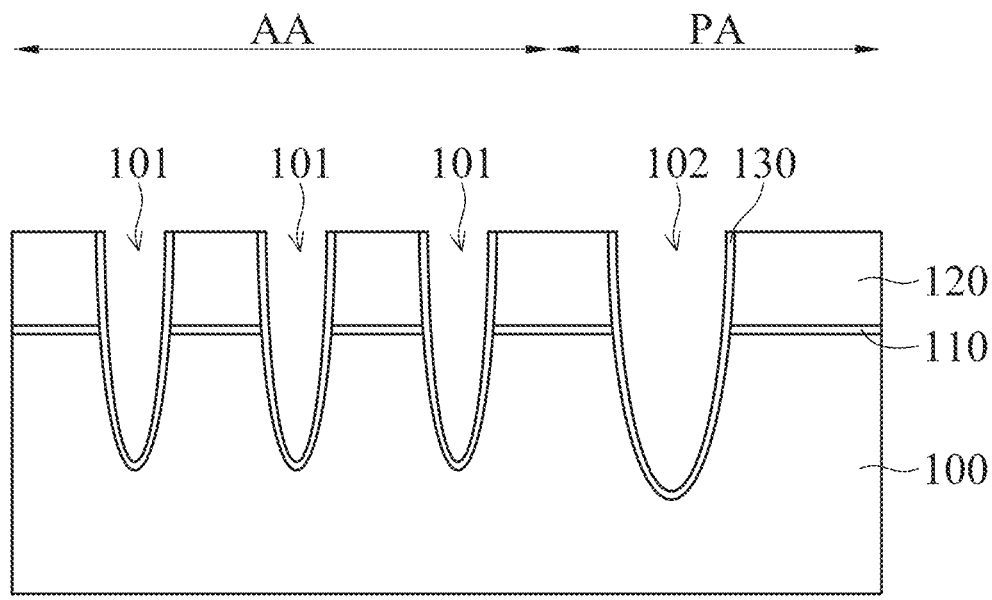
FIGS. 1-13 are schematic cross-sectional views of a semiconductor structure at various stages of formation, according to some embodiments of the present disclosure.

Referring to FIG. 1, a substrate 100 is provided. The substrate 100 may include an active area AA and a peripheral area PA. The active area AA may include active elements such as flash memory cells and isolation structures that isolate the active elements from each other. The peripheral area PA may surround the active area AA. In some embodiments, a circuit connecting the active elements may be disposed in the peripheral area PA.

A pad layer 110 and a mask layer 120 are sequentially formed on the substrate 100. Next, the mask layer 120, the pad layer 110, and the substrate 100 are patterned, to form openings in the mask layer 120, the pad layer 110, and the substrate 100. Next, a liner 130 is conformally formed in the opening. In some embodiments, a portion of the liner 130 is removed, to expose the top surface of the mask layer 120. The liner 130 may be conformally formed in first openings 101 of the active area AA and second openings 102 of the peripheral area PA. The depth and/or width of the first opening 101 may be smaller than the depth and/or width of the second opening 102.

The substrate 100 may be a silicon wafer, a bulk semiconductor, or a semiconductor-on-insulation substrate. Other types of substrates 100 are, for example, multilayer substrates or gradient substrates. The substrate 100 may be an elemental semiconductor, a compound semiconductor, or an alloy semiconductor. In some embodiments, the substrate 100 may be a doped or undoped semiconductor substrate.

The pad layer 110, the mask layer 120, and/or the liner 130 may include oxides, nitrides, oxynitrides, a combination thereof, or any other suitable dielectric material. For example, silicon oxide, silicon nitride, silicon oxynitride, high dielectric constant (high-k) dielectric material, any other suitable dielectric material, or a combination thereof. The high dielectric constant dielectric material may be metal oxide, metal nitride, metal silicide, transition metal oxide, transition metal nitride, transition metal silicide, metal oxynitride, metal aluminate, zirconium silicate, zirconium aluminate. In some embodiments, the pad layer 110 may be silicon oxide, the mask layer 120 may be silicon nitride, and the liner 130 may be high temperature oxide or silicon oxide. In some embodiments, other mask layers may be further included.

The pad layer 110, the mask layer 120 and/or the liner 130 may be formed by a deposition process or a thermal oxidation process. The aforementioned deposition process may include or may be a chemical vapor deposition (CVD) process.

Figure 2:
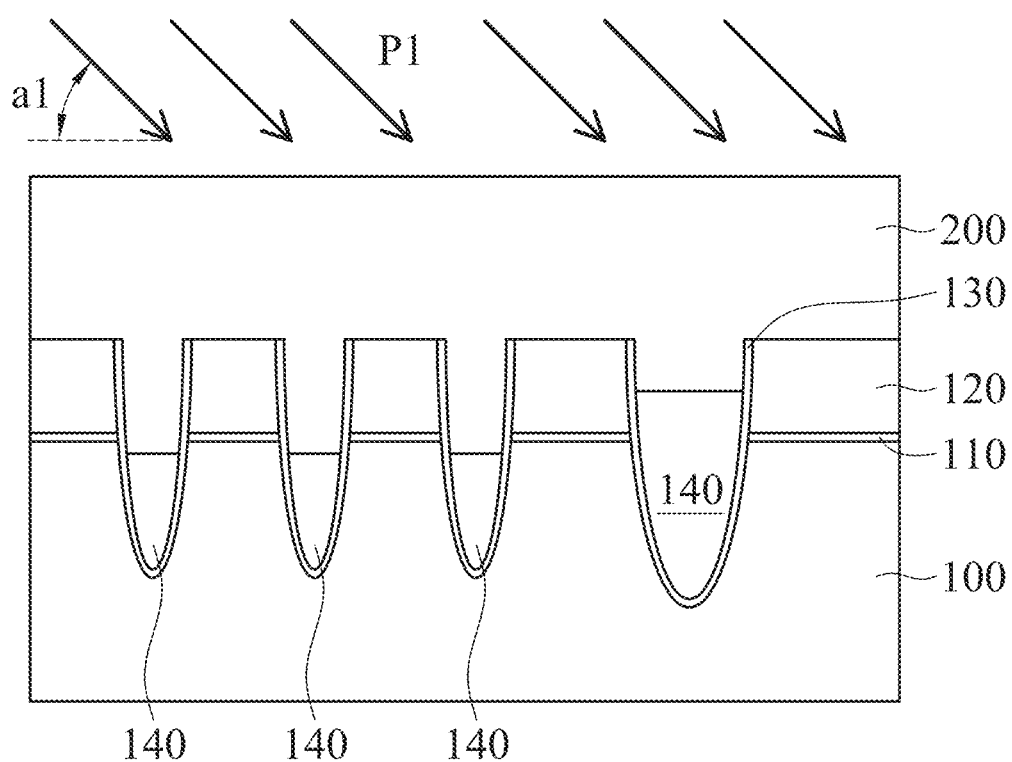

Referring to FIG. 2, a bottom isolation structure 140 is formed in the first opening 101 and the second opening 102. In some embodiments, in the active area AA, the top surface of the bottom isolation structure 140 is lower than the bottom surface of the pad layer 110. In some embodiments, in the peripheral area PA, the top surface of the bottom isolation structure 140 is higher than the top surface of the pad layer 110. The formation process and materials of the bottom isolation structure 140 may be the same or different from that of the pad layer 110, the mask layer 120 and/or the liner 130. The bottom isolation structure 140 may be silicon oxide. In some embodiments, the bottom isolation structure 140 may be formed by a liquid filling process, so as to avoid the problem of easy generation of voids due to a high aspect ratio. Therefore, the top surface of the bottom isolation structure 140 in the active area AA may be lower than the top surface of the bottom isolation structure 140 in the peripheral area PA. The top surface of the bottom isolation structure 140 in the active area AA may be lower than the top surface of the substrate 100. Therefore, a sufficient space may be left above the bottom isolation structure 140 for disposing the subsequently formed control dielectric layer and the control gate. Besides, avoids compressing the disposing space of the floating gate while forming the control dielectric layer. The top surface of the bottom isolation structure 140 in the peripheral area PA may be higher than the top surface of the substrate 100. Therefore, it can avoid the problem that when the implantation process is performed subsequently, the substrate 100 is easily damaged by the implantation process because of the relatively empty peripheral area PA. In other words, the bottom isolation structure 140 in the peripheral area PA may block the implantation process from damaging the top surface of the substrate 100. The density of the liner 130 may be greater than that of the bottom isolation structure 140, so that the insulation and isolation performances of the semiconductor device may be improved, thereby improving reliability of the semiconductor device.

As shown in FIG. 2, the isolation structure 200 is blanketly formed on the first opening 101, the second opening 102, and the mask layer 120. Specifically, the isolation structure 200 may be formed on the bottom isolation structure 140, the liner 130 and the mask layer 120. The formation process and materials of the isolation structure 200 may be the same or different from the that of the pad layer 110, the mask layer 120, the liner 130 and/or the bottom isolation structure 140. The isolation structure 200 may be, for example, silicon oxide and may be formed by a high density plasma chemical vapor deposition (HDP-CVD) process. In some embodiments, the bottom isolation structure 140 and the isolation structure 200 may be formed simultaneously by HDP-CVD process.

And then, the first implantation process P1 is performed on the isolation structure 200 and the mask layer 120 as the first angle a1. Thus, a portion of the structure as shown in FIG. 2 may be a nature mask of another portion of the showed structure, thereby the process of forming an additional mask may be omitted during the first implantation process P1.

Figure 3:
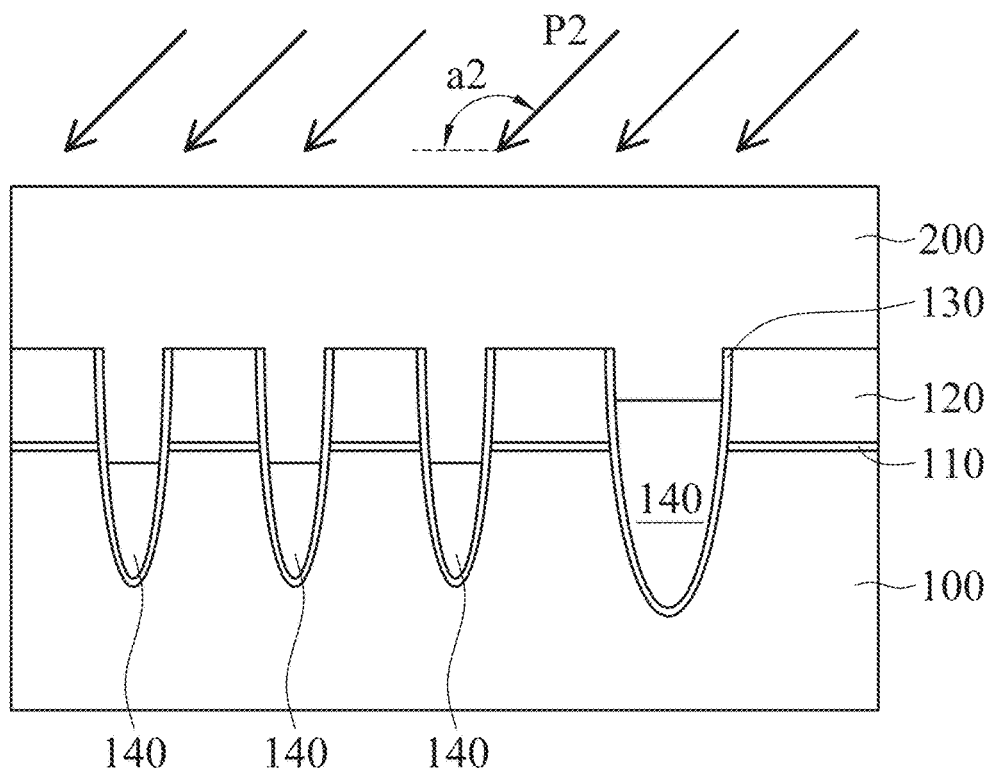

Referring to FIG. 3, a second implantation process P2 is performed on the isolation structure 200 and the mask layer 120 as a second angle a2, wherein the second angle a2 is different from the first angle a1. The first implantation process P1 and/or the second implantation process P2 may be an ion implantation process, and P-type dopants such as boron (B), aluminum (Al), and gallium (Ga), N-type dopants such as nitrogen (N), phosphorus (P), arsenic (As), or dopants such as argon (Ar) may be implanted according to the requirements of the implantation process. Therefore, dopants with different atomic mass may be selected to bombard the dielectric layers including different materials (e.g., the mask layer 120), so as to correspondingly break the molecular bonds of the dielectric layers.

Doping energies, dopant types, and dopant concentrations of the first implantation process P1 and the second implantation process P2 may be the same or different. The molecular weights of the dopants in the first implantation process P1 and the second implantation process P2 may be larger than that of the isolation structure 200 and the mask layer 120. Therefore, after the first implantation process P1 and the second implantation process P2 are performed, the structures of an upper portion of the isolation structure 200 and an upper portion of the mask layer 120 are damaged and loose. In some embodiments, nitrogen gas (N$_2$) is introduced during the first implantation process P1 and the second implantation process P2, to dope nitrogen (N) atoms into the upper portions of the isolation structure 200 and the mask layer 120.

In some embodiments, the first angle a1 may be greater than 0 degrees and less than 90 degrees, and the second angle a2 may be greater than 90 degrees. In some embodiments, the first angle a1 may be 1 to 45 degrees. For example, the first angle a1 may be 1 degree, 15 degrees, 30 degrees, 45 degrees, or a range of any combination of the foregoing values. In some embodiments, the second angle a2 may be 135 to 179 degrees. For example, the second angle a2 may be 135 degrees, 150 degrees, 165 degrees, 179 degrees or a range of any combination of the foregoing values. The first angle a1 and the second angle a2 may be complementary angles. In other words, the sum of the first angle a1 and the second angle a2 is 180 degrees. The arrival angles are controlled by using the first implantation process P1 and the second implantation process P2 as the first angle a1 and the second angle a2, respectively, thereby avoiding damage to the active area under the isolation structure 200 and the mask layer 120 or maintain integrity of other elements. Thus, the reliability of the semiconductor structure may be improved.

In some embodiments, with a normal direction of the substrate 100 as a symmetry axis, the implantation angle of the first implantation process P1 and that of the second implantation process P2 may be symmetrical or asymmetrical to each other.

Figure 4:
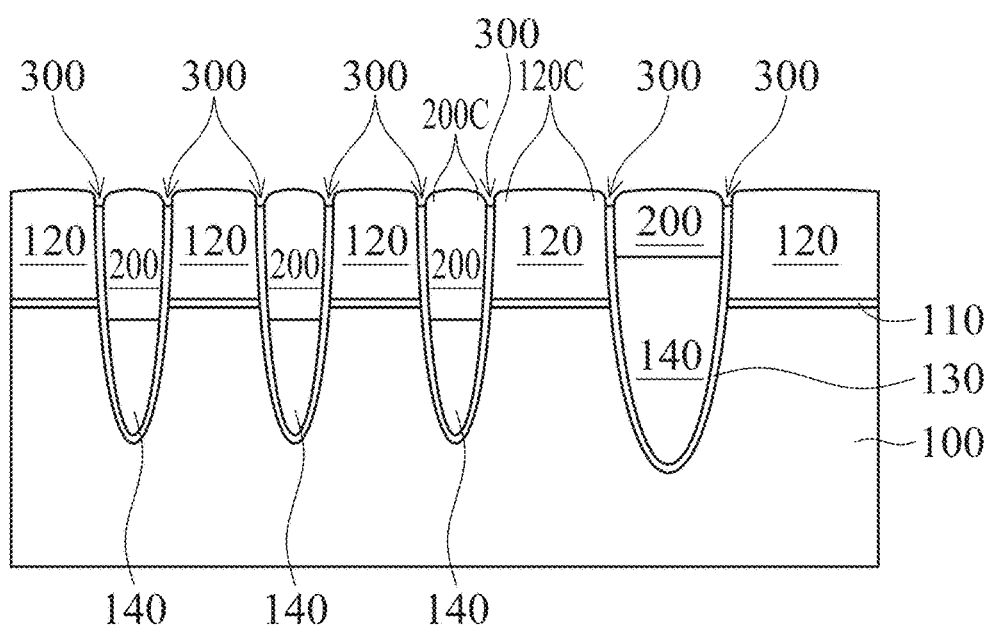

Referring to FIG. 4, a planarization process is performed, so that the top surface of the isolation structure 200 and the top surface of the mask layer 120 are aligned. In some embodiments, the planarization process may be a chemical mechanical polishing (CMP) process.

After the planarization process is performed, since the first implantation process P1 and the second implantation process P2 destroy the upper portions of the isolation structure 200 and the mask layer 120, the upper portions of the isolation structure 200 and the mask layer 120 is corner-rounded. In addition, concave portions 300 are formed on the top surface of the isolation structure 200 and the top surface of the mask layer 120. In some embodiments, the concave portion 300 is located on the interface between a side surface of the isolation structure 200 and a side surface of the mask layer 120. In some embodiments, the concave portions 300 are formed between the corners 200C of the isolation structure 200 and the corners 120C of the mask layer 120. After the CMP process is performed, the top surface of the liner 130 may be lower than the top surfaces of the isolation structure 200 and the mask layer 120.

In detail, since the top surface of the isolation structure 200 and the top surface of the mask layer 120 have been damaged, after performing the CMP process by using slurry, the corners 200C of the isolation structure 200 and the corners 120C of the mask layer 120 are corner-rounded. The reason is described below. The first implantation process P1 has the first angle a1 and the second implantation process P2 has the second angle a2, so the corners 200C of the isolation structure 200 and the corners 120C of the mask layer 120 are highly damaged by dopants in the implantation process according to the principle of the arrival angle. Thus, the structures of the corners 200C and corners 120C are relatively loose. Therefore, after the CMP process is performed, the corners 200C of the isolation structure 200 and the corners 120C of the mask layer 120 may be with arc angle. The curvature radii of the corners 200C and the corners 120C may be controlled according to the parameters of the first implantation process P1, the second implantation process P2 and the CMP process.

The mask layer 120 is removed in the subsequent process, and a first conductive layer and a second conductive layer serving as a floating gate are disposed at the position where the mask layer 120 was originally disposed. Therefore, when the corner 200C of the isolation structure 200 adjacent to the mask layer 120 is an arc angle, it is easier to fill and/or deposit the first conductive layer and the second conductive layer in order to form the floating gate. Therefore, the probability of generating voids and/or seams in the floating gate can be reduced, thereby improving the yield and reliability of the semiconductor process.

Referring to FIG. 3 and FIG. 4, in the embodiment in which the implantation angles of the first implantation process P1 and the second implantation process P2 are symmetrical, with the normal direction of the substrate 100 as a symmetry axis, the concave portion 300 may have a symmetrical profile. In the embodiment in which the implantation angles of the first implantation process P1 and the second implantation process P2 are asymmetrical, with the normal direction of the substrate 100 as a symmetry axis, the concave portion 300 may have an asymmetrical profile. Therefore, further doping processes can be performed to adjust the electrical properties. For example, the asymmetric profile of the concave portion 300 may affect the shape of the subsequently formed floating gate. Therefore, a doping process can be performed on the subsequently formed floating gate, in order to form a P-N junction in the floating gate, thereby improving the electron mobility and/or the switching rate at on-state.

Figure 5:
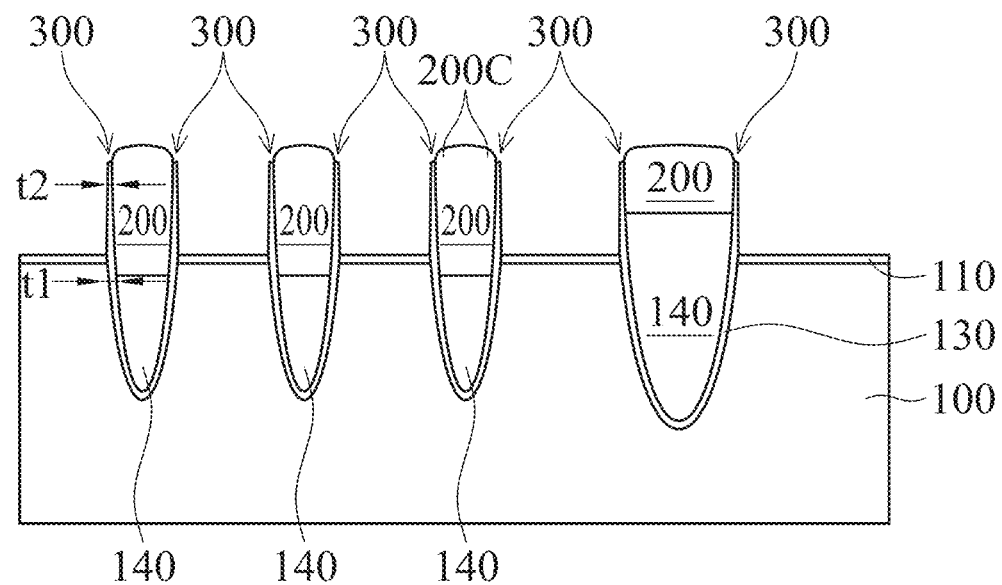

Referring to FIG. 5, after the isolation structure 200 and the mask layer 120 are corner-rounded, the mask layer 120 is removed, to expose the side surfaces of the isolation structure 200 and the liner 130. In some embodiments, a portion of the side surface of the liner 130 is covered by the substrate 100 and another portion of the side surface of the liner 130 is exposed. In some embodiments, the liner 130 and the isolation structure 200 protrude upward from the substrate 100.

The removal process may include an etching process, such as dry etching, wet etching, or other suitable etching methods. The dry etching may include a plasma etching, a plasma-free gas etching, a sputter etching, an ion milling, a reactive ion etching (RIE). The wet etching may include a process using acidic solutions, alkaline solutions, or solvents to remove at least a portion of the structure to be removed. In addition, the etching process may also be pure chemical etching, pure physical etching, or any combination thereof. In some embodiments, the corner-rounded mask layer 120 is removed by the wet etch process.

A portion of the upper portion of the liner 130 may be further removed, such that the liner 130 is tapered upward. For example, the liner 130 may be thinned, so that the liner 130 has a reduced thickness in a direction away from the substrate 100. In some embodiments, the lower portion of the liner 130 may have a first thickness t1, the upper portion of the liner 130 may have a gradually decreasing second thickness t2, and the first thickness t1 may be greater than the second thickness t2. In some embodiments, the liner 130 may have a tip portion.

The removal of the corner-rounded mask layer 120 and the portion of the upper portion of the liner 130 may be performed in the same process or in different processes. For example, the portion of the upper portion of the liner 130 may be removed simultaneously with the removal of the corner-rounded mask layer 120. Alternatively, the corner-rounded mask layer 120 may be removed first, and then the portion of the upper portion of the liner 130 may be removed. Based on the desired shape of the floating gate, other removal processes may be further performed to adjust the profile of the liner 130.

Figure 6:
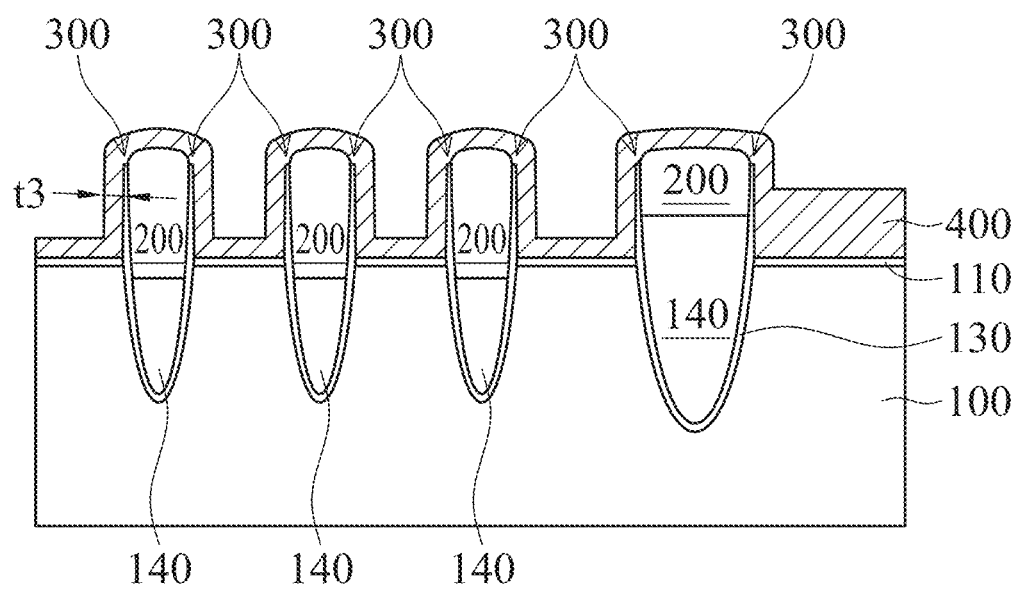

Referring to FIG. 6, a first conductive layer 400 is formed on the top surface and side surface of the isolation structure 200 and the substrate 100. The first conductive layer 400 may be conformally formed on the pad layer 110 and the top surfaces and side surfaces of the liner 130 and the isolation structure 200. The first conductive layer 400 may have a third thickness t3. The third thickness t3 of the first conductive layer 400 located in the active area AA may be greater than the thickness of the first conductive layer 400 located in the peripheral area PA.

The first conductive layer 400 may include polysilicon (polycrystalline silicon), amorphous silicon, metal, metal nitride, conductive metal oxide, a combination thereof, or other suitable materials, but the present disclosure is not limited thereto. In some embodiments, the first conductive layer 400 may include undoped or doped polysilicon, so as to adjust the electrical properties of the first conductive layer 400 by the dopants. The first conductive layer 400 may be formed by a chemical vapor deposition, a sputtering, a resistance heating evaporation, an electron beam evaporation, or any other suitable deposition process.

As shown in FIG. 6, since the upper portion of the isolation structure 200 has rounded corners 200C and concave portions 300, and the liner 130 has a second thickness t2 decreasing upward. Therefore, according to the aforementioned profile, the first conductive layer 400 can be more easily formed. In detail, since the isolation structure 200 has the rounded corners 200C and the concave portions 300, the step coverage of the first conductive layer 400 to the isolation structure 200 and the liner 130 can be improved, thereby improving the reliability of the first conductive layer 400.

In addition, since the liner 130 has the second thickness t2 decreasing upward, the aspect ratio and profile of a trench between adjacent isolation structures 200 can be adjusted, so that the area of the top surface of the aforementioned trench is larger than that of the bottom surface of the trench. Therefore, the first conductive layer 400 can be more easily filled. Therefore, voids and/or seams in the formed first conductive layer 400 can be avoided or reduced, thereby improving the reliability of the first conductive layer 400.

Figure 7:
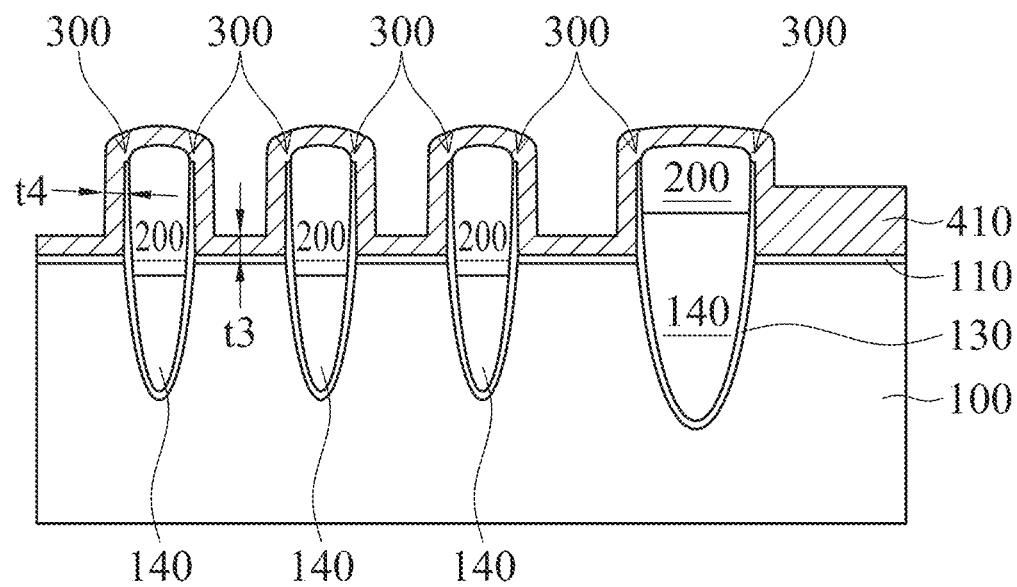

Referring to FIG. 7, portions of the top surface and the side surface of the first conductive layer 400 are removed to thin the first conductive layer 400. As a result, the third thickness t3 (as shown in FIGS. 6 and 7) of the first conductive layer 410 may be greater than the fourth thickness t4 (as shown in FIG. 7) of the first conductive layer 410, wherein the third thickness t3 is thickness of the first conductive layer 410 on the substrate 100 and the pad layer 110, and the fourth thickness t4 is the thickness of the first conductive layer 410 on the top surface and side surface of the isolation structure 200 and the side surfaces of the liner 130. In other words, the first conductive layer 410 on the top surfaces and side surfaces of the isolation structure 200 and the liner 130 is thinned by the removal process.

The aforementioned portions of the top and side surfaces of the first conductive layer 410 may be removed by a wet etching process. In the case where the first conductive layer 410 is polysilicon, an etching gas having a high etching selectivity for polysilicon is introduced. Since the introduced etching gas will first contact the top surface and the side surface of the first conductive layer 410, portions of the top surface and the side surface of the first conductive layer 410 may be mainly removed. In this embodiment, removal of the first conductive layer 400 on the substrate 100 and on the pad layer 110 can be avoided or almost avoided.

In some embodiments, since the third thickness t3 may be greater than the fourth thickness t4 of the first conductive layer 410, a doping energy and a doping depth during the subsequent implantation process of the first conductive layer 410 may be reduced, so as to improve the controllability of the subsequent implantation process. Since the isolation structure 200 is covered with the first conductive layer 410, the first conductive layer 410 may serve as a buffer layer that absorbs the doping energy first. In addition, since the third thickness t3 of the first conductive layer 410 may be greater than the fourth thickness t4 of the first conductive layer 410, other components located below the top surface of the first conductive layer 410 may be more easily doped through the implantation process.

Figure 8:
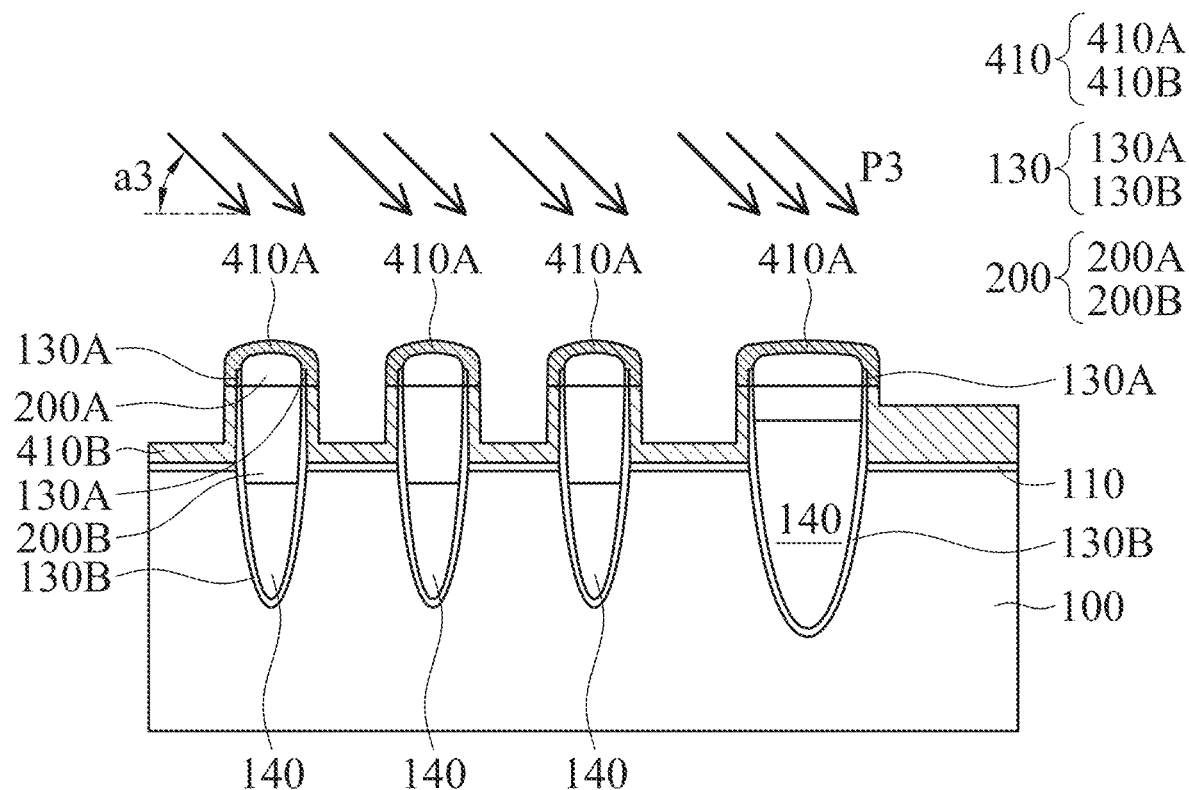

Referring to FIG. 8, a third implantation process P3 is performed on the first conductive layer 410 and the isolation structure 200 as a third angle a3, in order to form a doped portion 410A in the first conductive layer 410 and a doped portion 200A in the isolation structure 200. The third implantation process P3 may be further performed on the liner 130 to form a doped portion 130A in the liner 130. The third angle a3 may be greater than 0 degrees and less than 90 degrees. The third angle a3 may be the same as or different from the first angle a1.

The dopant type and dopant concentration of the third implantation process P3 may be the same as or different from those of the first implantation process P1 and/or the second implantation process P2. In some embodiments, the implantation energy of the third implantation process P3 may be lower than that of the first implantation process P1 and/or the second implantation process P2. In some embodiments, the molecular weight of the dopant of the third implantation process P3 is larger than the molecular weights of the first conductive layer 410, the isolation structure 200 and the liner 130. Therefore, upper portions of the structures of the first conductive layer 410, the isolation structure 200, and the liner 130 may be loosened by the third implantation process P3. In some embodiments, a mixed gas of nitrogen and argon ($N_2$/Ar) may be introduced during the third implantation process P3, so as to dope nitrogen atoms and argon (Ar) atoms. In other embodiments, the third implantation process P3 may be doped with arsenic (As) atoms.

Figure 9:
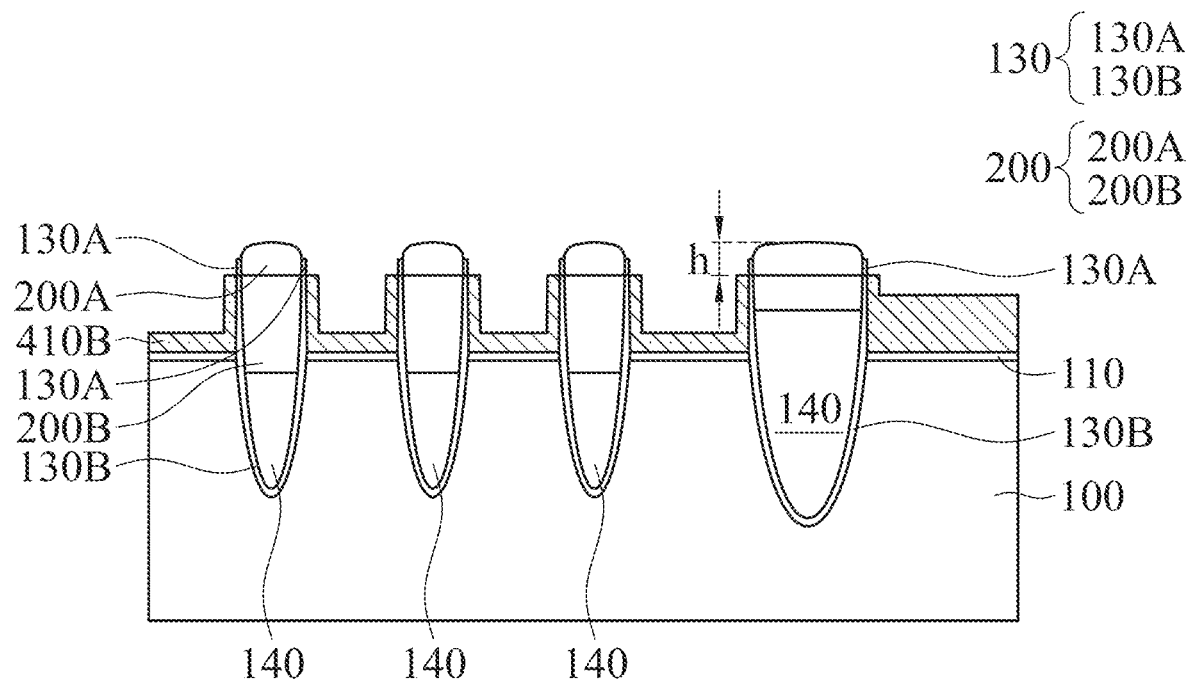

Referring to FIG. 9, the doped portion 410A of the first conductive layer 410 is removed in order to expose the doped portion 200A of the isolation structure 200 and leave a portion (the remaining portion 410B) of the first conductive layer 410. In some embodiments, the doped portion 130A of the liner 130 is exposed. Since the remaining portion 410B of the first conductive layer 410 is not damaged by the third implantation process P3, a polishing rate of the remaining portion 410B is lower than that of the doped portion 410A. Therefore, removal of the remaining portion 410B of the first conductive layer 410 can be avoided. In some embodiments, the top surface of the remaining portion 410B of the first conductive layer 410 is lower than the top surface of the doped portion 200A of the isolation structure 200. In some embodiments, the top surfaces of the doped portion 200A of the isolation structure 200 and the doped portion 130A of the liner 130 protrude upward from the remaining portion 410B of the first conductive layer 410.

A height h is between the top surface of the doped portion 200A of the isolation structure 200 and the top surface of the remaining portion 410B of the first conductive layer 410. The height h can be controlled based on the material selection, thereby improving a uniformity of performing the planarization process. For example, the height h may be in the range of about 1 nm to about 10 nm. The height h may be 1 nm, 2.5 nm, 5 nm, 7.5 nm, 10 nm, or a range of any combination of the foregoing values. When the polishing selectivity between different materials to be subjected to the planarization process is relatively large, that is, when the differences in the polishing rates of different materials are relatively large, the height h can be controlled to be higher.

The present disclosure uses the implantation process to destroy materials with a lower polishing rate for the polishing slurry used in the CMP process, so that the various materials included in the semiconductor structure have substantially the same or similar polishing selectivity. Thus, the uniformity of the planarization process may be improved. That is, the uniformity of the planarization process can be adjusted by controlling the third implantation process P3 and the height h.

Figure 10:
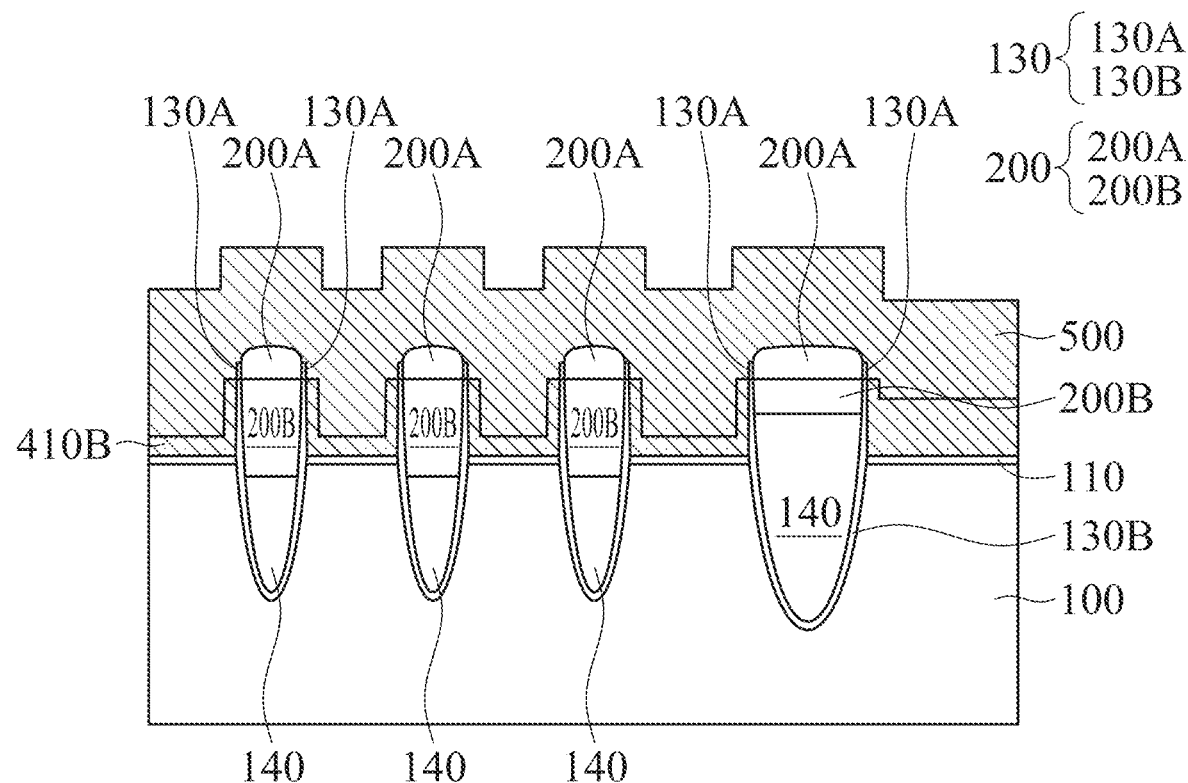

Referring to FIG. 10, a second conductive layer 500 is formed on the first conductive layer 410 and the isolation structure 200. Specifically, the second conductive layer 500 is formed on the remaining portion 410B of the first conductive layer 410, the doped portion 200A of the isolation structure 200, and the doped portion 130A of the liner 130. The material and forming process of the second conductive layer 500 may be the same or different from that of the first conductive layer 410. For example, the materials of the second conductive layer 500 and the first conductive layer 410 may be both polysilicon, so that the first conductive layer 410 and the second conductive layer 500 do not substantially have an interface. In some embodiments, the first conductive layer 410 and the second conductive layer 500 may have interfaces due to different forming materials. Since a portion of the second conductive layer 500 is directly formed on the doped portion 200A of the isolation structure 200 and the doped portion 130A of the liner 130, excessive deposition of the second conductive layer 500 on the doped portion 200A of the isolation structure 200 and the doped portion 130A of the liner 130 protruding from the substrate 100 can be avoided based on the degree of compatibility of materials.

In some embodiments, the isolation structure 200 has rounded corners 200C and rounded concave portions 300 (as shown in FIG. 7), and the top surface of the remaining portion 410B of the first conductive layer 410 is lower than the top surfaces of doped portion 130A of the liner 130 and the doped portion 200A of the isolation structure 200. Therefore, the coverage of the second conductive layer 500 to the isolation structure 200, the liner 130 and the remaining portion 410B of the first conductive layer 410 can be improved, thereby improving the reliability of the second conductive layer 500.

In addition, the liner 130 has a second thickness t2 that decreases upward, and the fourth thickness t4 of the remaining portion 410B of the first conductive layer 410 located on the side surface of the liner 130 is smaller than the third thickness t3 of the remaining portion 410B of the first conductive layer 410 on the substrate 100. Therefore, the aspect ratio and profile of the trenches between the adjacent isolation structures 200 can be adjusted so that the area of the top surface of the trenches is larger than that of the bottom surface. Thus, the second conductive layer 500 can be filled more easily. Therefore, voids and/or seams in the formed second conductive layer 500 can be avoided or reduced, thereby improving the reliability of the second conductive layer 500. In some embodiments, the first conductive layer 400 and the second conductive layer 500 may be formed by a deposition-etching-deposition (DED) process.

In other embodiments, the second conductive layer 500 may be directly formed on the doped portion 410A of the first conductive layer 410 without removing the doped portion 410A of the first conductive layer 410. Then, by performing a planarization process, the top surfaces of the remaining portion 410B of the first conductive layer 410, the remaining portion 500B of the second conductive layer 500, and the remaining portion 200B of the isolation structure 200 are aligned.

Figure 11:
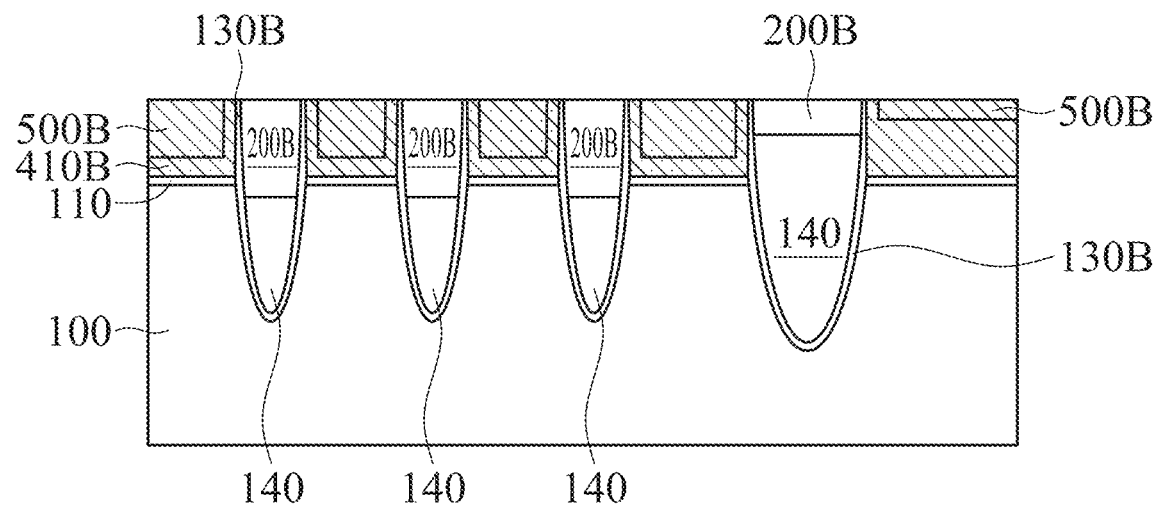

Referring to FIG. 11, a planarization process is performed so that the top surfaces of the second conductive layer 500, the first conductive layer 410, the isolation structure 200 and the liner 130 are aligned. In some embodiments, a planarization process is performed to remove a portion of the second conductive layer 500, the doped portion 200A of the isolation structure 200, and the doped portion 130A of the liner 130. Accordingly, top surfaces of the remaining portion 500B of the second conductive layer 500, the remaining portion 410B of the first conductive layer 410, the remaining portion 200B of the isolation structure 200, and the remaining portion 130B of the liner 130 are aligned with each other.

In detail, the planarization process may be a CMP process using slurry, so the CMP process may use both mechanical force and chemical force to planarize the material. However, the slurry used in the CMP process is often limited by the physical properties of the slurry. For example, the polishing selectivity of the polishing slurry to the materials to be polished is insufficient, resulting in the problem of over-polishing of some materials and insufficient polishing of some materials. In other words, after the CMP process is performed, there may still be a non-planar top surface.

For example, the slurry of common CMP process has a higher polishing rate for polysilicon and a lower polishing rate for oxide-like materials. Therefore, after the CMP process is performed, the top surface of the polysilicon material is lower than the top surface of other materials such as oxide-like materials, resulting in a problem of insufficient polishing uniformity. In the case of the insufficient polishing uniformity, the controllability and reliability of the subsequent process will be affected, thereby the entire semiconductor device will be deteriorated. For example, if the third implantation process P3 is not performed, after the planarization process is performed, the doped portion 200A of the isolation structure 200 and the doped portion 130A of the liner 130 may still protrude from the remaining portion 410B of the first conductive layer of 410 and the remaining portion 500B of the second conductive layer 500.

However, in the present disclosure, the doped portion 200A of the isolation structure 200 and the doped portion 130A of the liner 130 protrude upward from the remaining portion 410B of the first conductive layer 410 with a step difference, and the doped portion 200A and the doped portion 130A are affected by the third implantation process P3. As a result, the structures of the doped portion 200A of the isolation structure 200 and the doped portion 130A of the liner 130 are relatively loose. Therefore, during the planarization process, the doped portion 200A of the isolation structure 200 and the doped portion 130A of the liner 130 can be removed more easily, so that the top surfaces of the remaining portion 200B of the isolation structure 200, the remaining portion 130B of the liner 130, the remaining portion 410B of the first conductive layer 410, and the remaining portion 500B of the second conductive layer 500 are aligned. In other words, the uniformity of the planarization process is increased by performing the third implantation process P3 to destroy components that may protrude from the remaining portion 410B of the first conductive layer 410.

Figure 12:
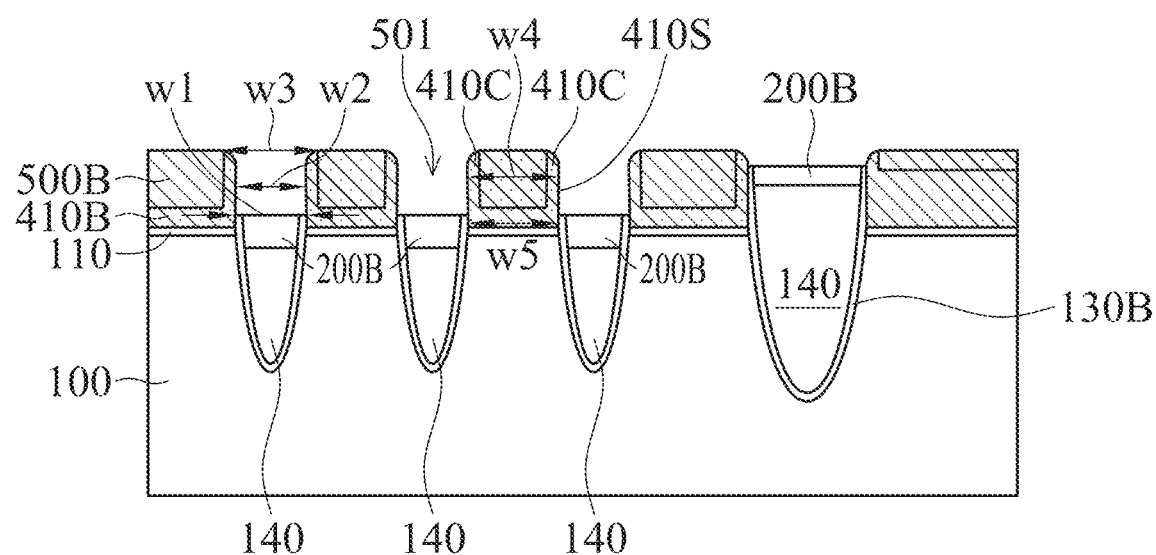

Referring to FIG. 12, the remaining portion 200B of the isolation structure 200 is etched-back so that the top surface of the remaining portion 200B of the isolation structure 200 is lower than the top surfaces of the remaining portion 500B of the second conductive layer 500 and the remaining portion 410B of the first conductive layer 410. Since the remaining portion 200B of the isolation structure 200 is etched-back to form the trench for accommodating the control gate, the parameters of etch-back process significantly affect the electrical performance of the subsequently formed semiconductor structure. After the planarization process as shown in FIG. 11 is performed, since a flat top surface with a high degree of uniformity can be obtained, the etch-back depth of the etch-back process can be more accurately controlled, thereby improving the reliability of the semiconductor structure.

The etch-back process may further remove the remaining portion 130B of the liner 130 such that the top surface of the remaining portion 130B of the liner 130 is aligned with the top surface of the remaining portion 200B of the isolation structure 200. The etch-back process can expose the side surface of the remaining portion 410B of the first conductive layer 410 and form an opening 501. As shown in FIG. 12, since the liner 130 as shown in FIG. 5 has the second thickness t2 that decreases upward, after the etch-back process is performed, a first width w1 of a bottom portion of the opening 501 is greater than a second width w2 of a middle portion the opening 501.

In addition, the etch-back process can further round the remaining portion 410B of the first conductive layer 410 adjacent to the opening 501, so that the remaining portion 410B of the first conductive layer 410 has rounded corners 410C. Therefore, a third width w3 of a top of the opening 501 may have greater than the second width w2 of the middle portion of the opening 501. In the case where the third width w3 of the opening 501 is greater than the second width w2 of the opening 501, interlayer dielectric layers and a third conductive layer can be more easily subsequently filled in the opening 501. In other words, since the remaining portion 410B of the first conductive layer 410 has rounded corners 410C, the reliability of the subsequently formed third conductive layer may be improved.

Figure 13:
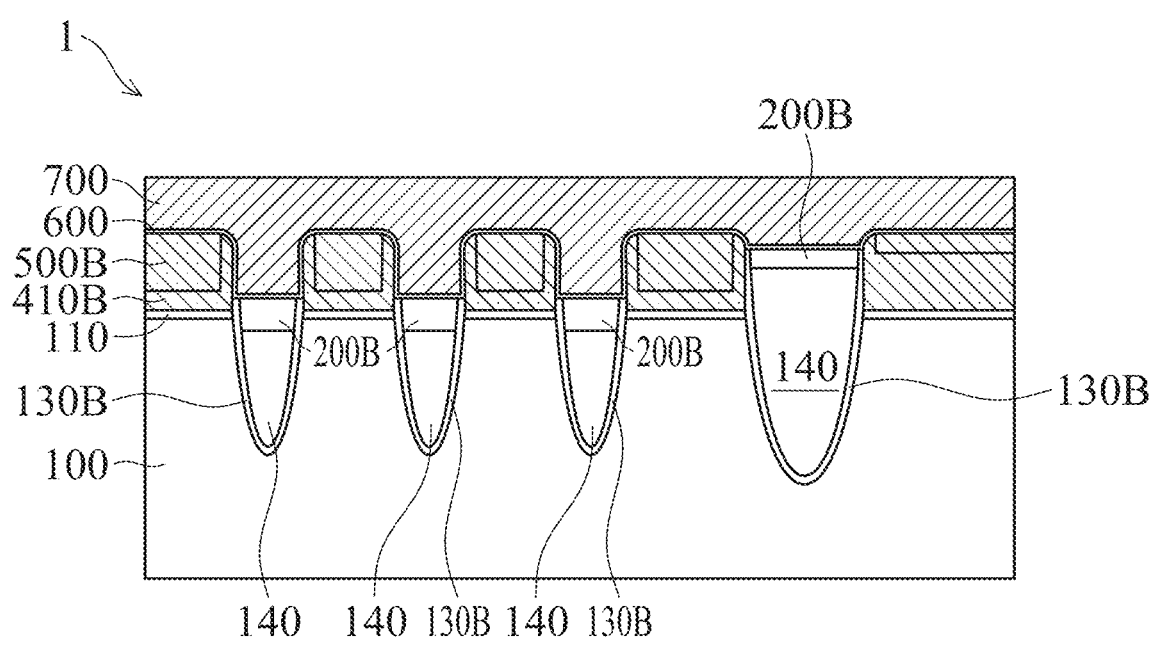

Referring to FIG. 13, an interlayer dielectric layer 600 is conformally formed on the remaining portion 500B of the second conductive layer 500, the remaining portion 410B of the first conductive layer 410, the remaining portion 130B of the liner 130, and the remaining portion 200B of the isolation structure 200. The interlayer dielectric layer 600 may be a single-layer structure or include a plurality of sub-layers, such as an oxide-nitride-oxide (ONO) structure.

As shown in FIG. 13, a third conductive layer 700 is formed on the interlayer dielectric layer 600 to obtain the semiconductor structure 1. The semiconductor structure 1 may be a memory device, or other processes may be further performed on the semiconductor structure 1 to form a memory device. In some embodiments, a double patterning process may be further performed on the third conductive layer 700 to form word lines. In some embodiments, spacers may be further formed on the sidewalls of the third conductive layer 700 to reduce the generation of leakage current.

In the semiconductor structure 1, the remaining portion 500B of the second conductive layer 500 and the remaining portion 410B of the first conductive layer 410 may collectively function as a floating gate in the memory device. The remaining portion 410B of the first conductive layer 410 may have a concave portion. The remaining portion 410B of the first conductive layer 410 may be U-shaped, V-shaped or concave-shaped. The remaining portion 410B of the first conductive layer 410 may have a concave top surface. The remaining portion 500B of the second conductive layer 500 may be disposed in the concave portion of the remaining portion 410B. The remaining portion 410B of the first conductive layer 410 may cover the remaining portion 500B of the second conductive layer 500. The remaining portion 410B of the first conductive layer 410 may be in contact with the bottom surface and side surface of the remaining portion 500B of the second conductive layer 500.

In some embodiments, the remaining portion 130B of the liner 130 may have a second thickness t2 that decreases upward, and the profile of the floating gate corresponds to the profile of the liner 130. Therefore, the floating gate formed by the remaining portion 500B of the second conductive layer 500 and the remaining portion 410B of the first conductive layer 410 can have the inclined side surface 410S, which can increase the charge capacity stored in the floating gate, thereby increasing the storage capacity of the subsequently formed flash memory device. In the cross-sectional view, the fourth width w4 of the upper portion of the floating gate formed by the remaining portion 500B of the second conductive layer 500 and the remaining portion 410B of the first conductive layer 410 may be greater than the fifth width w5 of the lower portion of the floating gate. For example, the area of the top surface of the floating gate may be larger than the area of the bottom surface of the floating gate. Therefore, the charge capacity stored in the floating gate can also be increased. In some embodiments, the charge capacity of the floating gate can be increased by a factor of 1.01 to 2. In some embodiments, the interlayer dielectric layer 600 can be used as a control dielectric layer in the memory device, and the third conductive layer 700 can be used as a control electrode in the memory device.

In summary, in the present disclosure, a conductive material such as polysilicon is deposited stepwise by forming the first conductive layer and the second conductive layer, respectively. The implantation process is performed between the formation process of the first conductive layer and the formation process of the second conductive layer, so as to destroy the structure of non-polysilicon materials such as oxide-like materials, thereby improving the uniformity of subsequent CMP processes. Therefore, the reliabilities of the subsequent etch-back process and the filling process are improved. For example, when a single CMP process is performed, the top surface of the semiconductor structure may still be an uneven surface due to the different polishing selectivity of the various materials included in the semiconductor structure. However, the present disclosure can improve the uniformity of the planarization process by combining the implantation process with the CMP process.

In detail, by using the implantation process (such as, the third implantation process) to destroy portions of the first conductive layer and the isolation structure, the portions of the first conductive layer and the isolation structure are fragile, and then the second conductive layer is formed on the first conductive layer. Afterwards, a planarization process is performed, so that the top surfaces of the second conductive layer, the first conductive layer, and the isolation structure are aligned, in order to obtain a flatter top surface. In short, the present disclosure performs several deposition processes, and performs the implantation process between the deposition processes to destroy the upper portion of the oxide-like material, thereby improving the uniformity of the subsequent CMP process.

Furthermore, the present disclosure can be further performed with the corner-rounding process, so that the upper width of the opening and/or the trench is larger than the lower width, so as to further improve the reliability of the filling process. The present disclosure can make the isolation structure have rounded corners by performing the implantation processes with different arrival angles, and then performing the CMP process. In the case, the subsequent filling process of the first conductive layer and the second conductive layer serving as the floating gate can be more easily performed, thereby enhancing the reliability of the first conductive layer and the second conductive layer.

The foregoing outlines features of several embodiments so that those skilled in the art may better understand the aspects of the present disclosure. Those skilled in the art should appreciate that they may readily use the present disclosure as a basis for changing, replacing, substituting, or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, replaces, substitutes and modifies, and alterations herein without departing from the spirit and scope of the present disclosure.

What is claimed is:

1. A semiconductor structure, comprising:
   a pad layer disposed on a substrate;
   a first conductive layer disposed on the pad layer;
   a second conductive layer disposed on the first conductive layer;
   an interlayer dielectric layer disposed on the first conductive layer and the second conductive layer and in contact with top surfaces of the first conductive layer and the second conductive layer; and
   a control gate disposed on the interlayer dielectric layer, wherein a thickness of the first conductive layer in contact with a side surface of the second conductive layer is smaller than a thickness of the first conductive layer in contact with a bottom surface of the second conductive layer.

2. The semiconductor structure as claimed in claim 1, wherein the first conductive layer and the second conductive layer are formed as a floating gate, and an area of a top surface of the floating gate is larger than an area of a bottom surface of the floating gate.

3. The semiconductor structure as claimed in claim 1, wherein the first conductive layer has a concave portion, and the second conductive layer is disposed in the concave portion of the first conductive layer.

4. The semiconductor structure as claimed in claim 1, further comprising:
   a liner disposed in the substrate;
   a bottom isolation structure disposed on the liner; and
   an isolation structure disposed on the bottom isolation structure;
   wherein the liner has a reduced thickness in a direction away from the substrate.

5. The semiconductor structure as claimed in claim 4, wherein the liner comprises:
   a lower portion disposed in the substrate and having a constant first thickness;
   an upper portion disposed on the lower portion and having a gradually decreasing second thickness.

6. The semiconductor structure as claimed in claim 4, wherein the liner has a tip portion.

7. The semiconductor structure as claimed in claim 1, wherein the second conductive layer and the first conductive layer have an inclined side surface.

8. The semiconductor structure as claimed in claim 7, wherein the inclined side surface corresponds to a side surface of a liner disposed in the substrate.

9. The semiconductor structure as claimed in claim 1, wherein the first conductive layer has a rounded corner.

* * * * *